United States Patent
Stacey

(10) Patent No.: US 6,258,652 B1
(45) Date of Patent: Jul. 10, 2001

(54) SPIRAL-SHAPED INDUCTOR STRUCTURE FOR MONOLITHIC MICROWAVE INTEGRATED CIRCUITS HAVING AIR GAPS IN UNDERLYING PEDESTAL

(75) Inventor: William F. Stacey, Somerville, MA (US)

(73) Assignee: Raytheon Company, Lexington, MA (US)

( * ) Notice: Subject to any disclaimer, the term of this patent is extended or adjusted under 35 U.S.C. 154(b) by 0 days.

(21) Appl. No.: 09/704,892

(22) Filed: Nov. 2, 2000

Related U.S. Application Data

(62) Division of application No. 09/012,083, filed on Jan. 22, 1998, now Pat. No. 6,169,320.

(51) Int. Cl.$^7$ ................................................. H01L 29/00
(52) U.S. Cl. .............................................. 438/238; 438/381
(58) Field of Search ................................... 438/238, 381; 257/528–531

(56) References Cited

U.S. PATENT DOCUMENTS

| | | |
|---|---|---|
| 4,729,510 | 3/1988 | Landis . |
| 5,095,357 | 3/1992 | Andoh et al. . |
| 5,372,967 | 12/1994 | Sundaram et al. . |
| 5,410,179 | 4/1995 | Kornrumpf et al. . |
| 5,652,157 | 7/1997 | Hirano et al. . |
| 5,719,073 | 2/1998 | Shaw et al. . |
| 5,773,870 | 6/1998 | Su et al. . |
| 5,915,188 | * 6/1999 | Ramakrishnan et al. ............ 438/381 |
| 6,002,161 | 12/1999 | Yamazaki . |
| 6,008,102 | 12/1999 | Alford et al. . |

FOREIGN PATENT DOCUMENTS

| | | |
|---|---|---|
| 61-144052 | 7/1986 | (JP) . |
| 406021533 | 1/1994 | (JP) . |
| 6-21533 | 1/1994 | (JP) . |

* cited by examiner

*Primary Examiner*—Jey Tsai
(74) *Attorney, Agent, or Firm*—Daly, Crowley & Mofford, LLP

(57) ABSTRACT

An inductor structure having a single crystal body with a spiral shaped pedestal formed in one surface and a ground plane conductor disposed over an opposite surface of the body. A spiral shaped conductor is disposed over the spiral shaped pedestal. Portions of the conductor are separated from underlying portions of the pedestal by air. Laterally adjacent portions of the conductor are separated by air. The single crystal body comprises gallium arsenide.

6 Claims, 17 Drawing Sheets

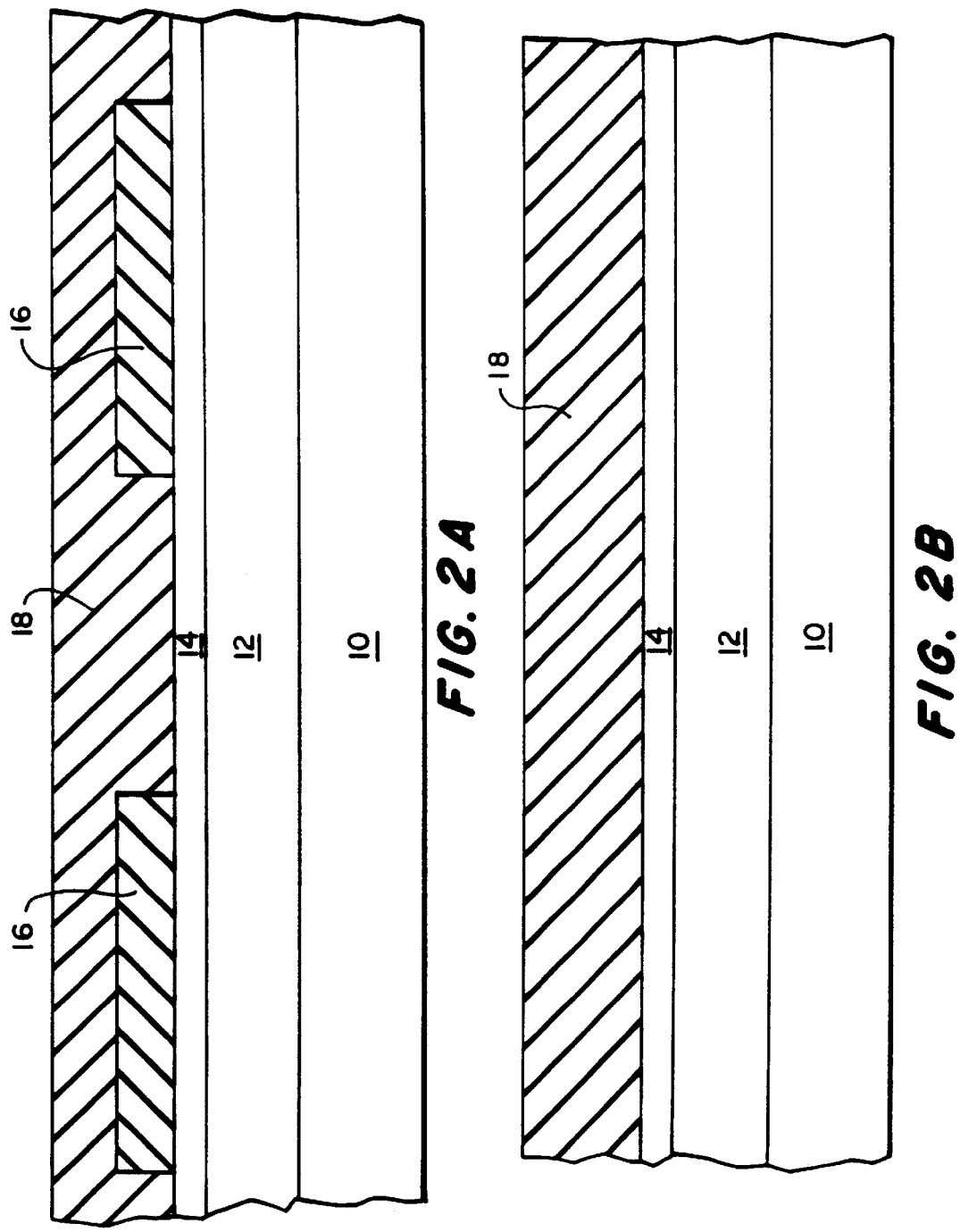

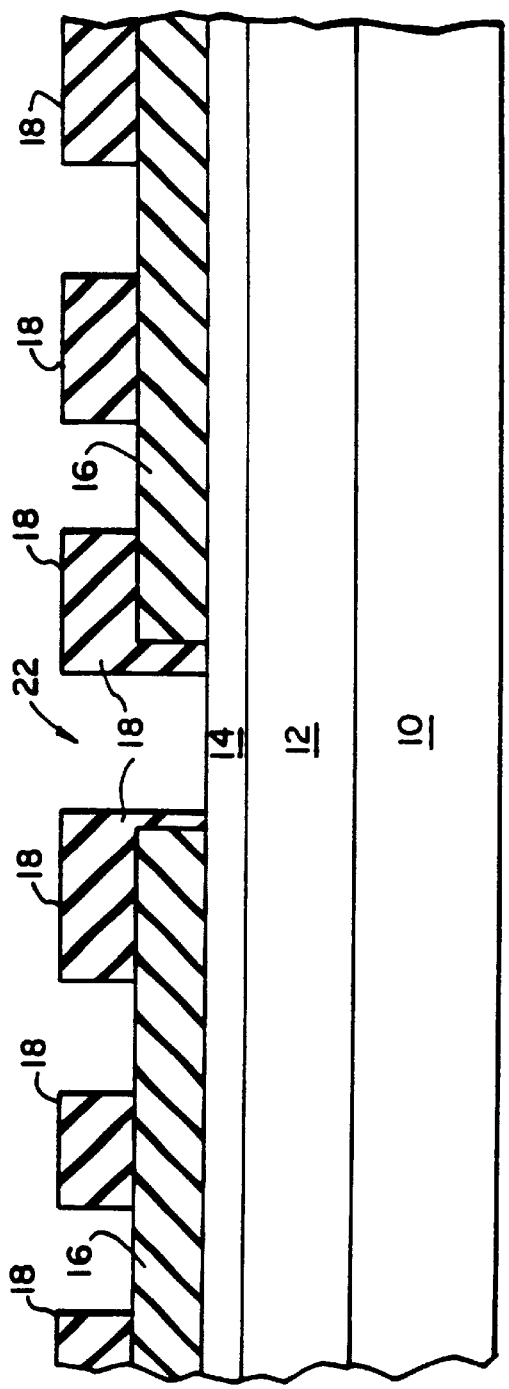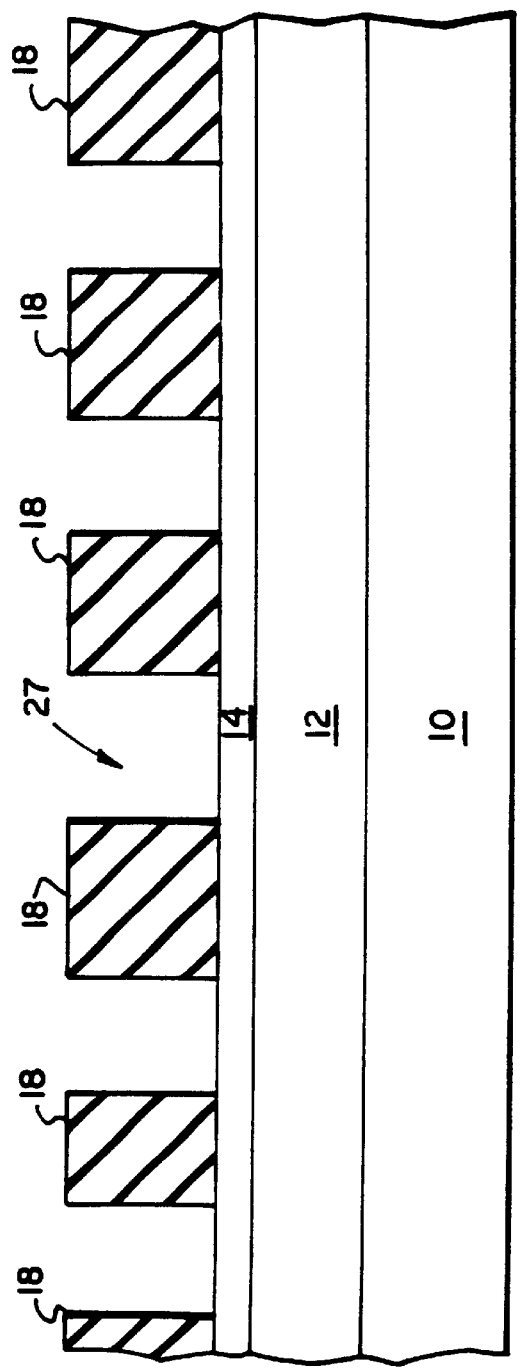

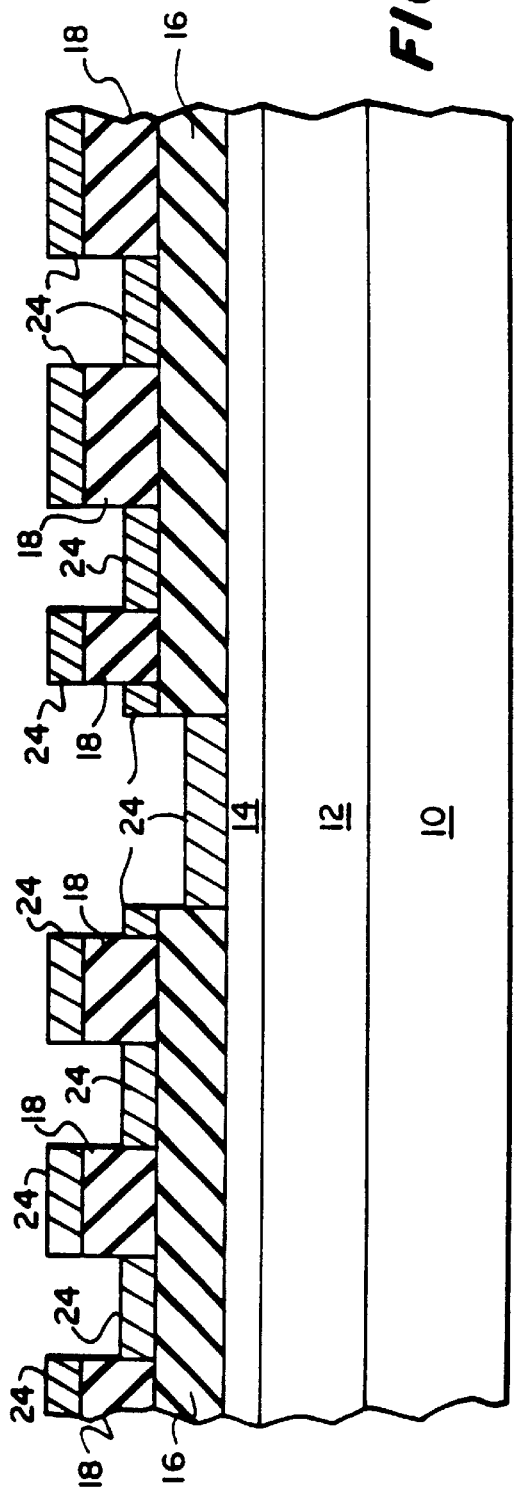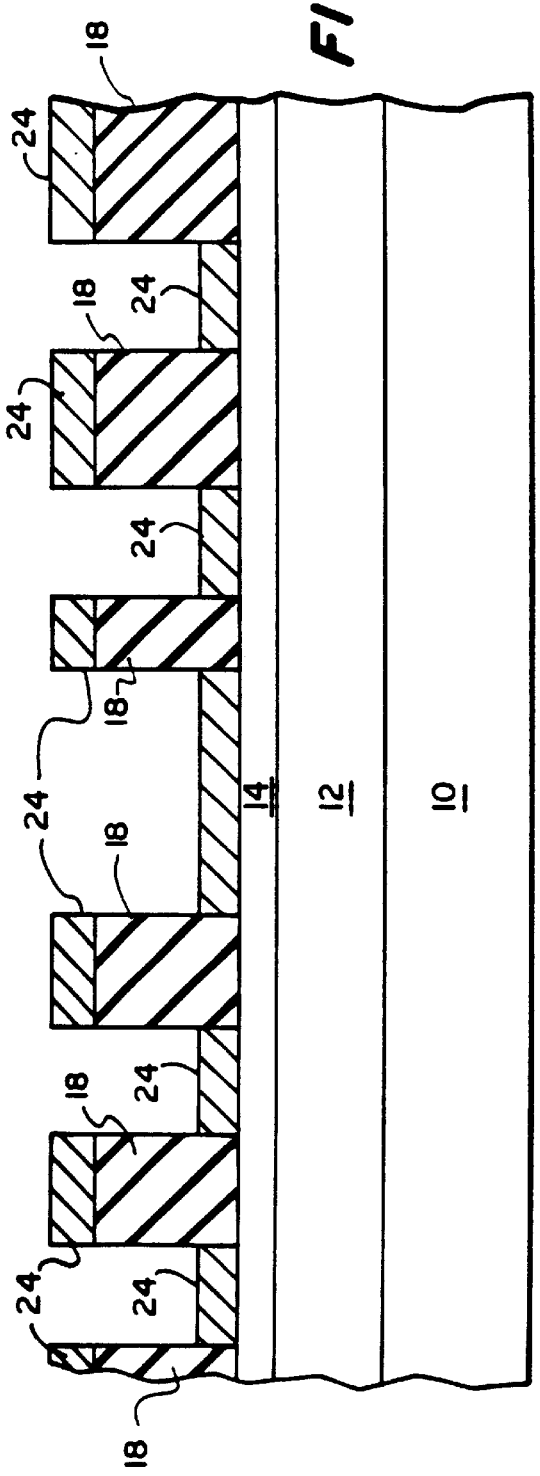

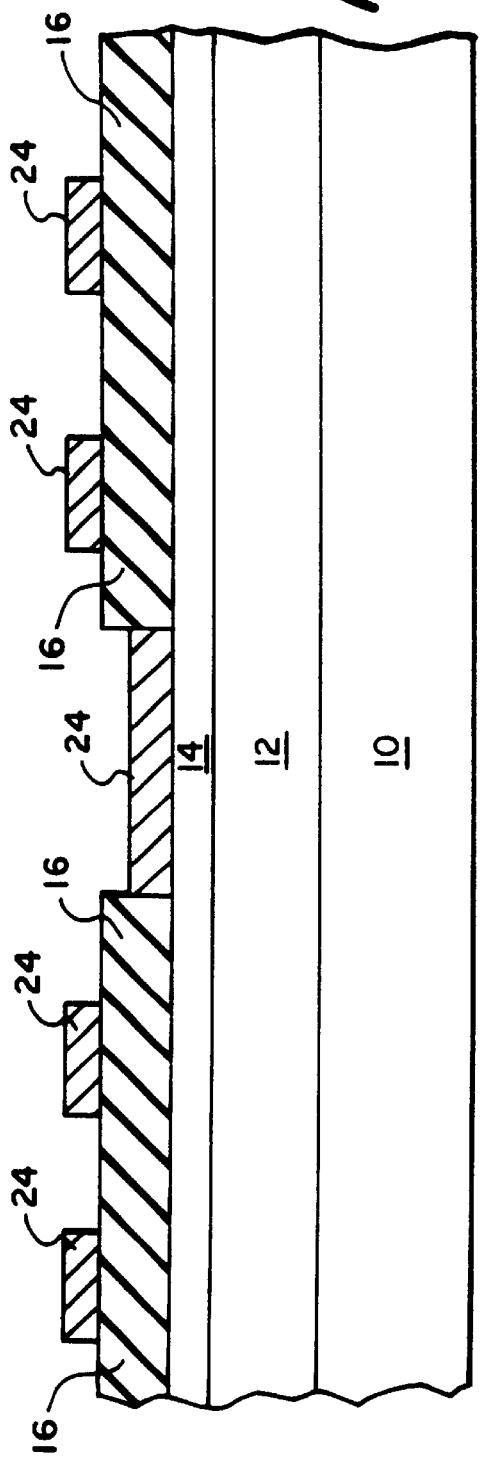
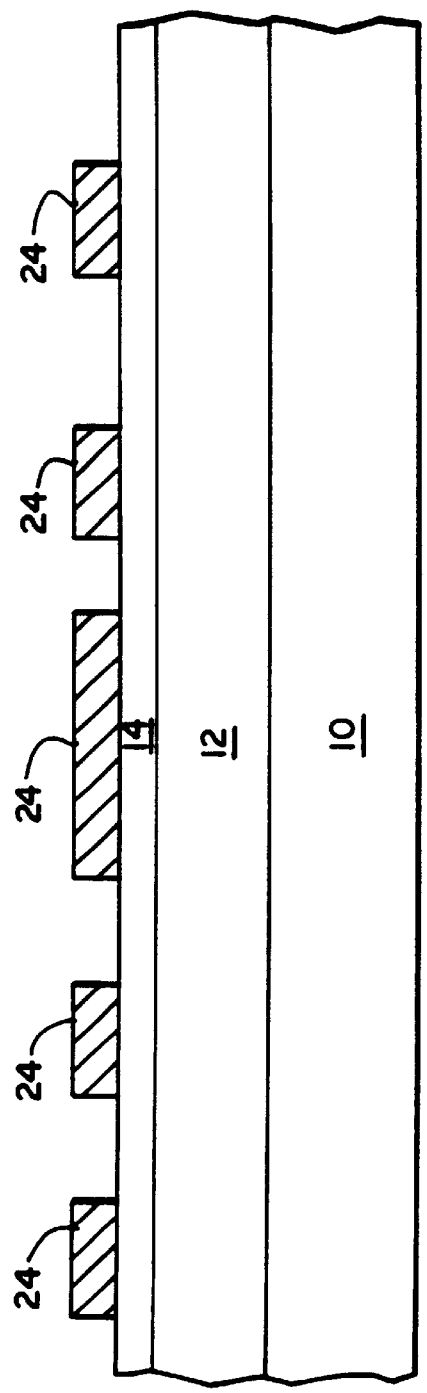
FIG. 5A
FIG. 5B

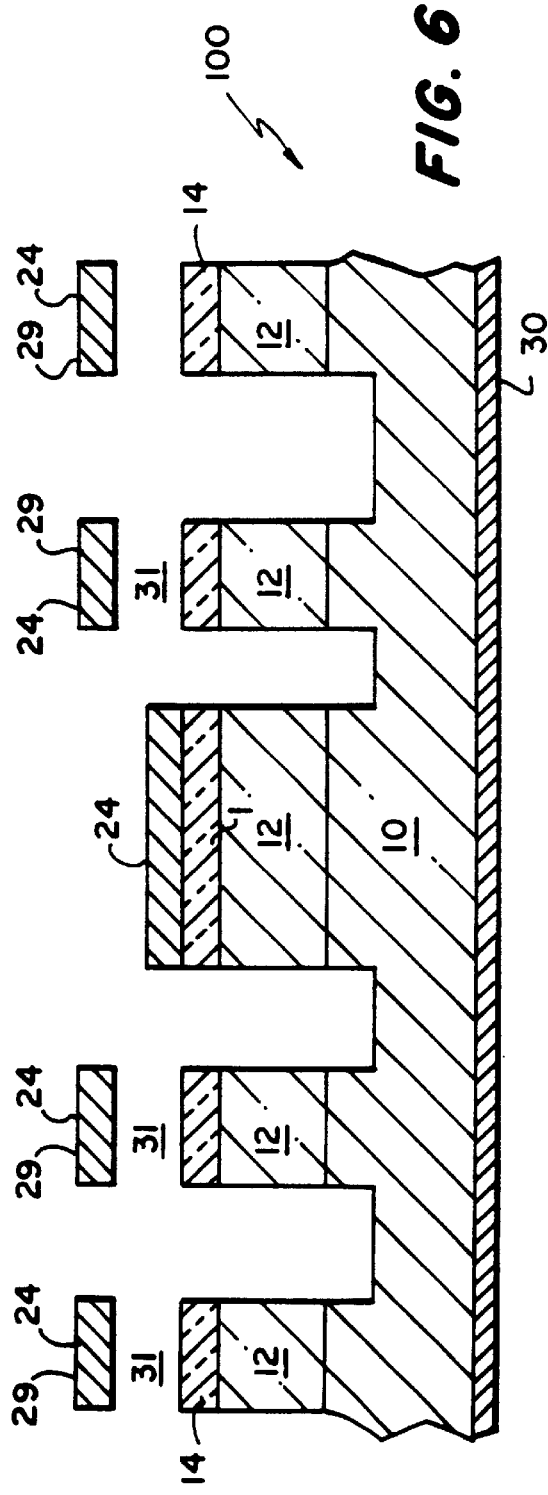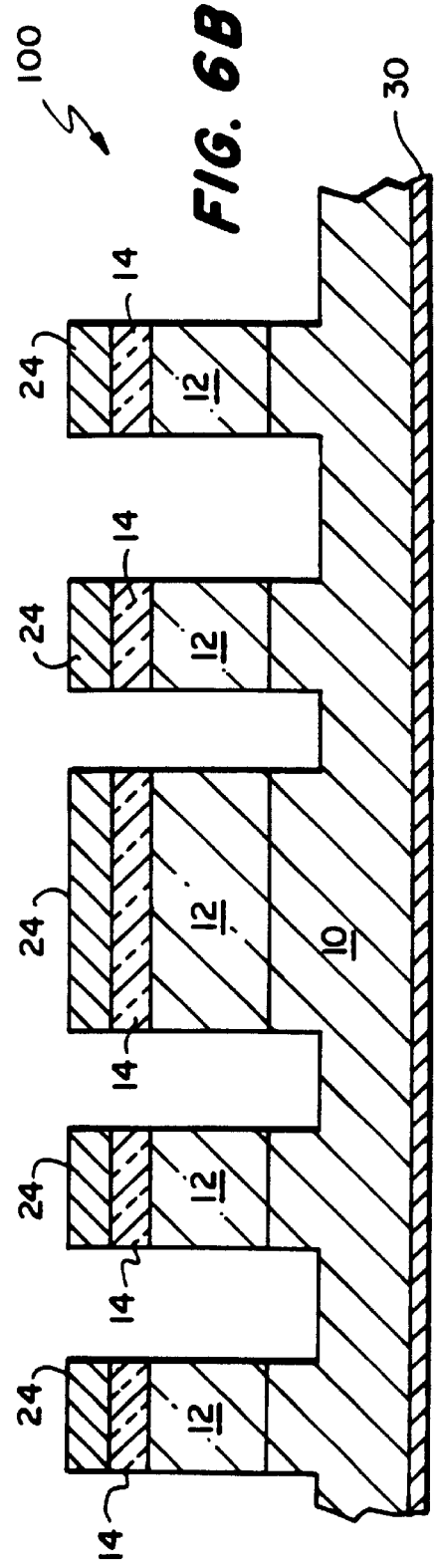

SPIRAL-SHAPED INDUCTOR STRUCTURE FOR MONOLITHIC MICROWAVE INTEGRATED CIRCUITS HAVING AIR GAPS IN UNDERLYING PEDESTAL

RELATED PATENT APPLICATIONS

This is a divisional of patent application Ser. No. 09/012,083 filed Jan. 22, 1998 now U.S. Pat. No. 6,169,320.

BACKGROUND OF THE INVENTION

This invention relates generally to inductor structures and manufacturing methods and more particularly to spiral inductors adapted for use in monolithic microwave integrated circuits.

As is known in the art, active devices, such as transistors, and passive devices, such as resistors, capacitors and inductors, have been formed on a common single crystal substrate, such as gallium arsenide (GaAs), as a microwave monolithic integrated circuit. One technique used to form the inductor has been to: first form the active devices in the gallium arsenide, deposit a passivation layer of silicon nitride over the processed gallium arsenide, and pattern a layer of photoresist deposited over the silicon nitride layer with a spiral shaped window formed therein. Next, a sequence of titanium followed by gold is deposited over the photoresist layer and through the spiral shaped window onto the exposed portions of the silicon nitride. The photoresist layer is then removed, i.e., "lifted-off", leaving a spiral shaped inductor on the silicon nitride passivation layer.

While such technique has been useful in many application, the inductor has a relatively low impedance resulting in a relatively narrow bandwidth device.

SUMMARY OF THE INVENTION

In accordance with one feature of the invention, an inductor structure is provided. The inductor has a dielectric body. A spiral shaped pedestal is disposed in one surface of the body. A ground plane conductor is disposed over an opposite surface of the body. A spiral shaped conductor is disposed over the spiral shaped dielectric pedestal.

With such structure, a portion of the electric field in the conductor passes through air having a relatively high dielectric constant thereby increasing the impedance and bandwidth of the inductor.

In accordance with another feature of the invention a method is provided for making an inductor structure. The method includes the steps of: providing a dielectric body; patterning a metalization layer disposed over the dielectric body into a spiral shaped electrical conductor; etching surface portions of the dielectric body exposed by the patterned metalization layer providing a pedestal structure disposed under the patterned metalization layer.

In a preferred embodiment, after the metalization layer has been patterned, a third photoresist layer is deposited over the formed surface. A window is formed in the third photoresist layer over the patterned metalization layer. Exposed portions of the passivation layer are removed. Exposed portions of the dielectric body are removed using a dry, vertically directional etch to produce an inductive structure.

BRIEF DESCRIPTION OF THE DRAWING

These and other features of the invention, as well as the invention itself, will become more readily apparent from the following detailed description when read together with the following drawings, in which:

FIGS. 2A and 2B are diagramnmatical cross-section elevation views taken along lines 2A—2A and 2B—2B in FIG. 2;

FIGS. 3A and 3B are diagrammatical cross-section elevation views taken along lines 3A—3A and 3B—3B in FIG. 3;

FIGS. 4A, 4B and 4C are diagrammatical cross-section elevation views taken along lines 4A—4A, 4B—4B and 4C—4C in FIG. 4;

FIGS. 5A, 5B and 5C are diagrammatical cross-section elevation views taken along lines 5A—5A, 5B—5B and 5C—5C in FIG. 5;

FIGS. 6A, 6B and 6C are diagrammatical cross-section elevation views taken along lines 6A—6A, 6B—6B and 6C—6C in FIG. 6;

DESCRIPTION OF THE PREFERRED EMBODIMENTS

Figure 1:
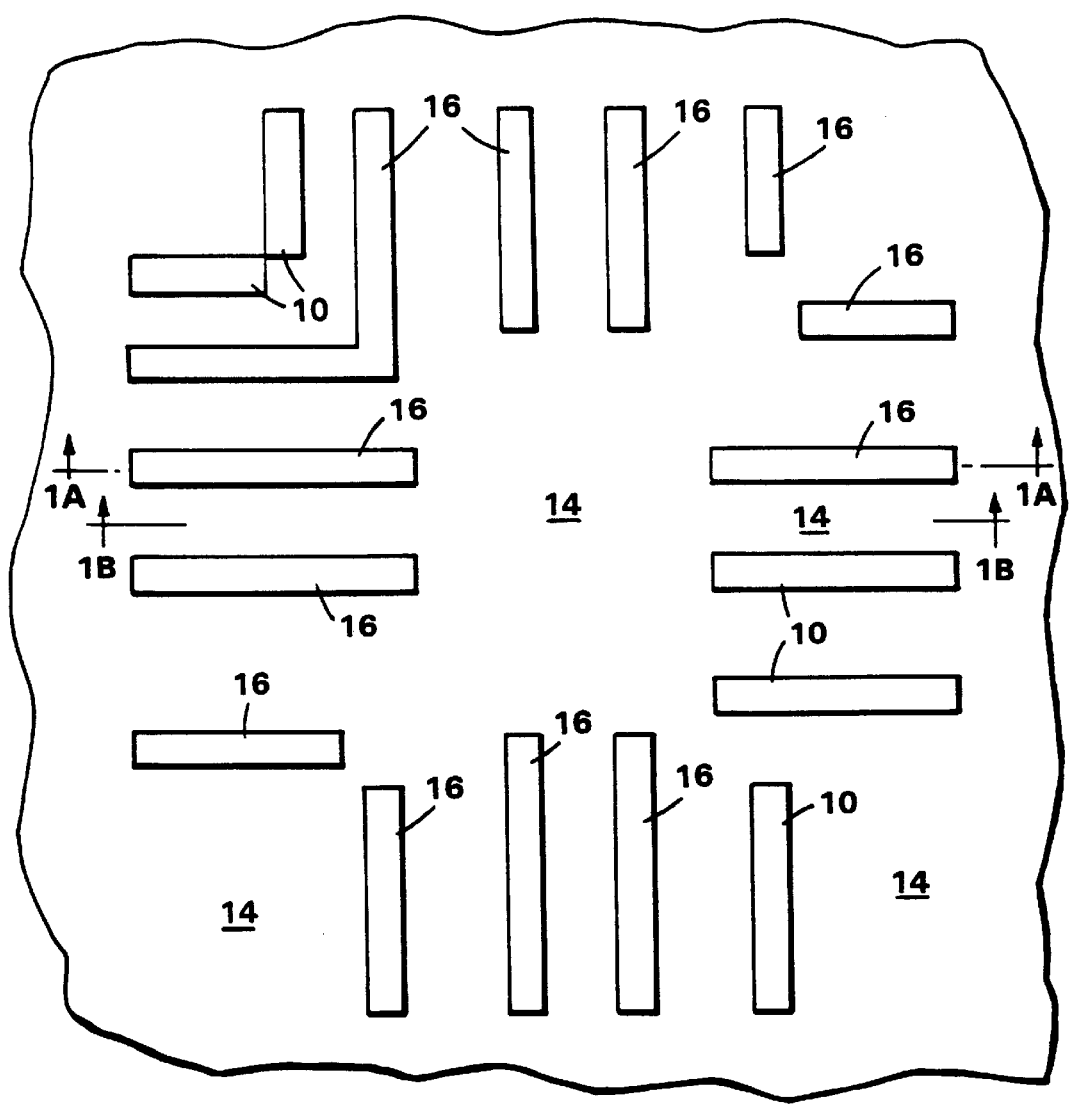
FIG. 1 is a plan view of a substrate having a patterned photolithograph layer disposed over the surface of the substrate at one stage in the fabrication of an inductor in accordance with the invention.
Figure 1A:
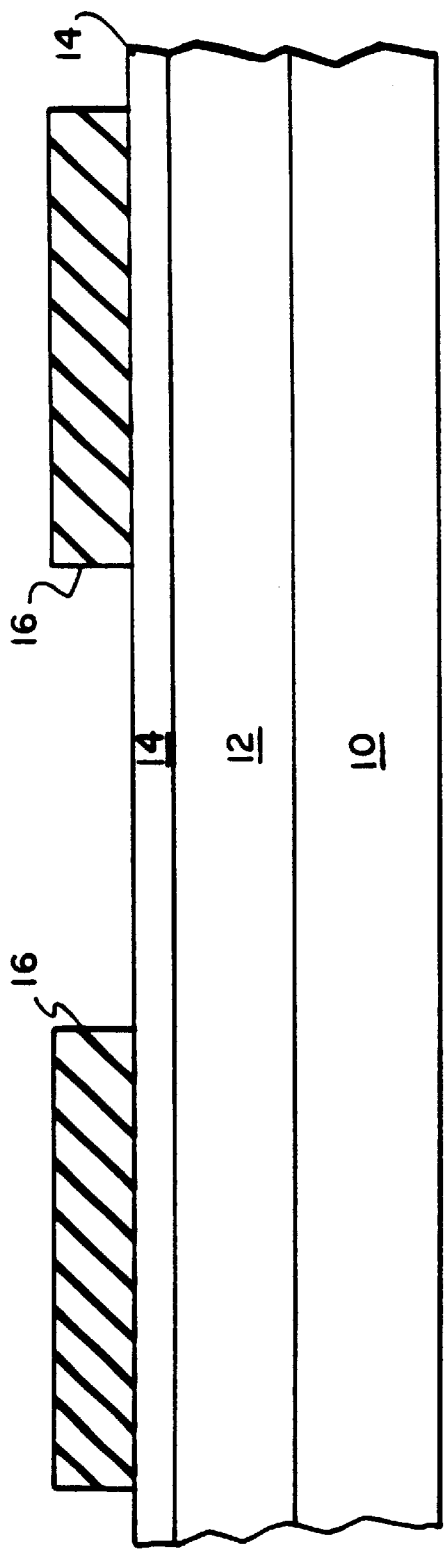
FIGS. 1A and 1B are diagrammatical cross-section elevation views taken along lines 1A—1A and 1B—1B in FIG. 1.
Figure 1B:
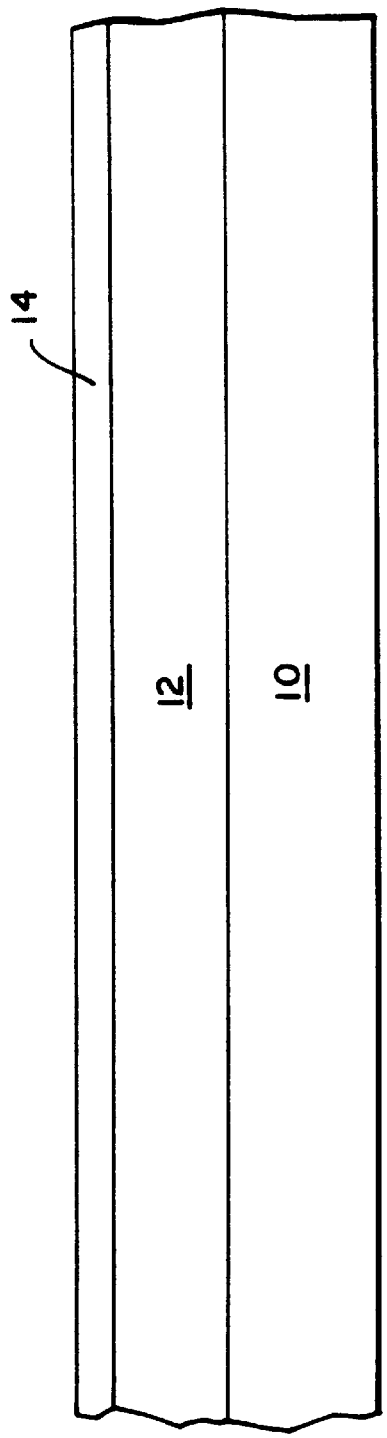

Referring now to FIGS. 1, 1A and 1B, a single crystal substrate 10, here semi-insulating gallium arsenide is shown having a doped layer 12 of gallium arsenide epitaxially grown over the upper surface of the substrate 10. In one region, not shown, of the epitaxial layer 12 may be formed-active devices, such as field effect transistors, while an indudctor structure 100 (FIGS. 6, 6A, 6B, 6C and 6D) is formed in a manner to be described in the region shown.

An insulating, or passivation, layer, here typically silicon nitride 14, is formed over the surface of the epaxial layer 12, as shown. Next, a first photoresist layer 16, here polymethylglutarimide (PMGI), is formed over the passivation layer 14. The first photoresist layer 16 is selectively masked with unmasked portions being exposed to deep ultra-violent light in a conventional manner to form, after development, a segmented spiral shaped pattern as shown more clearly in FIG. 1.

Figure 2:
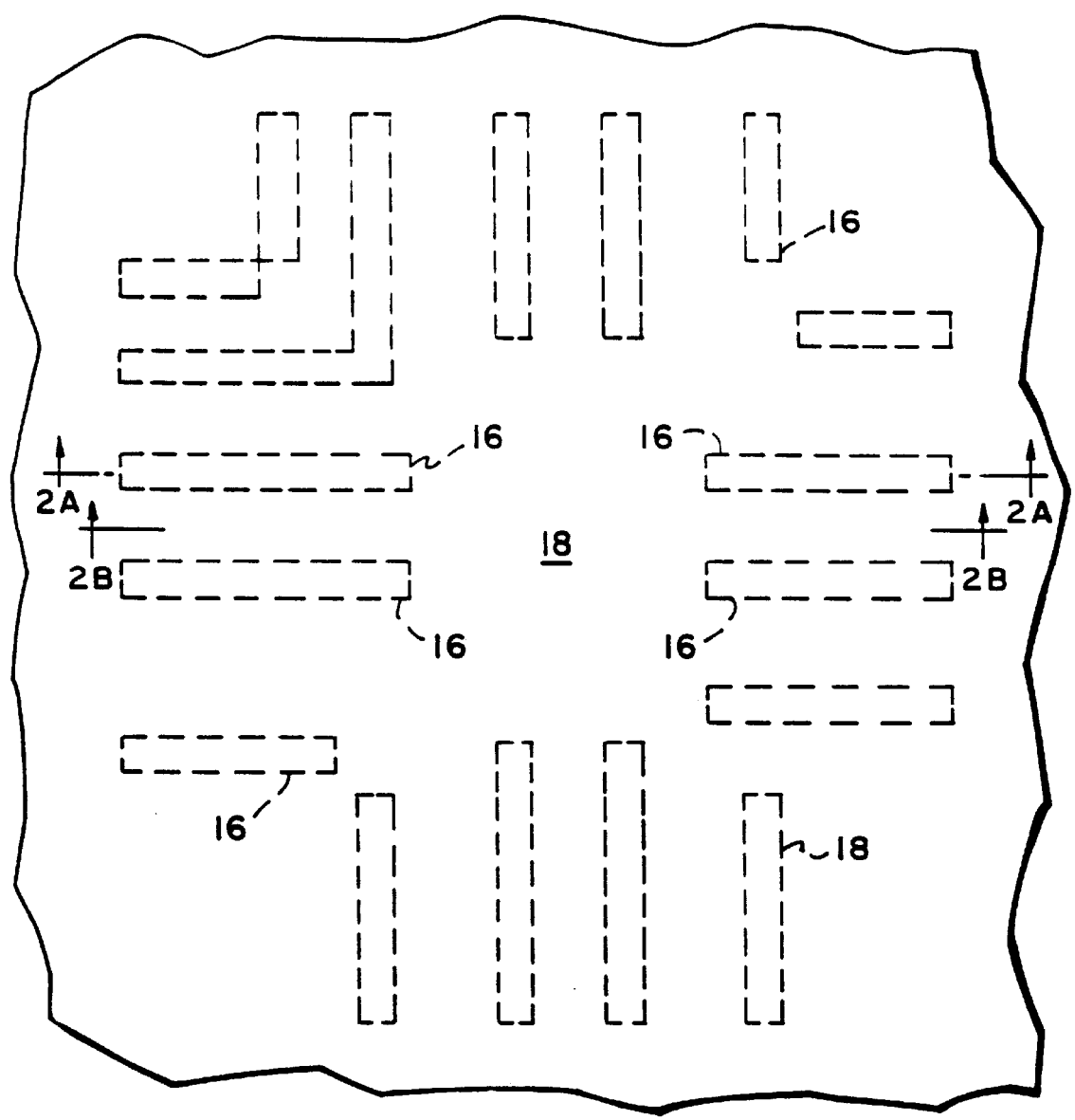
FIG. 2 is a plan view of the substrate having a different photolithograph layer disposed over the surface of the substrate at another stage in the fabrication of an inductor in accordance with the invention.
Figure 3:
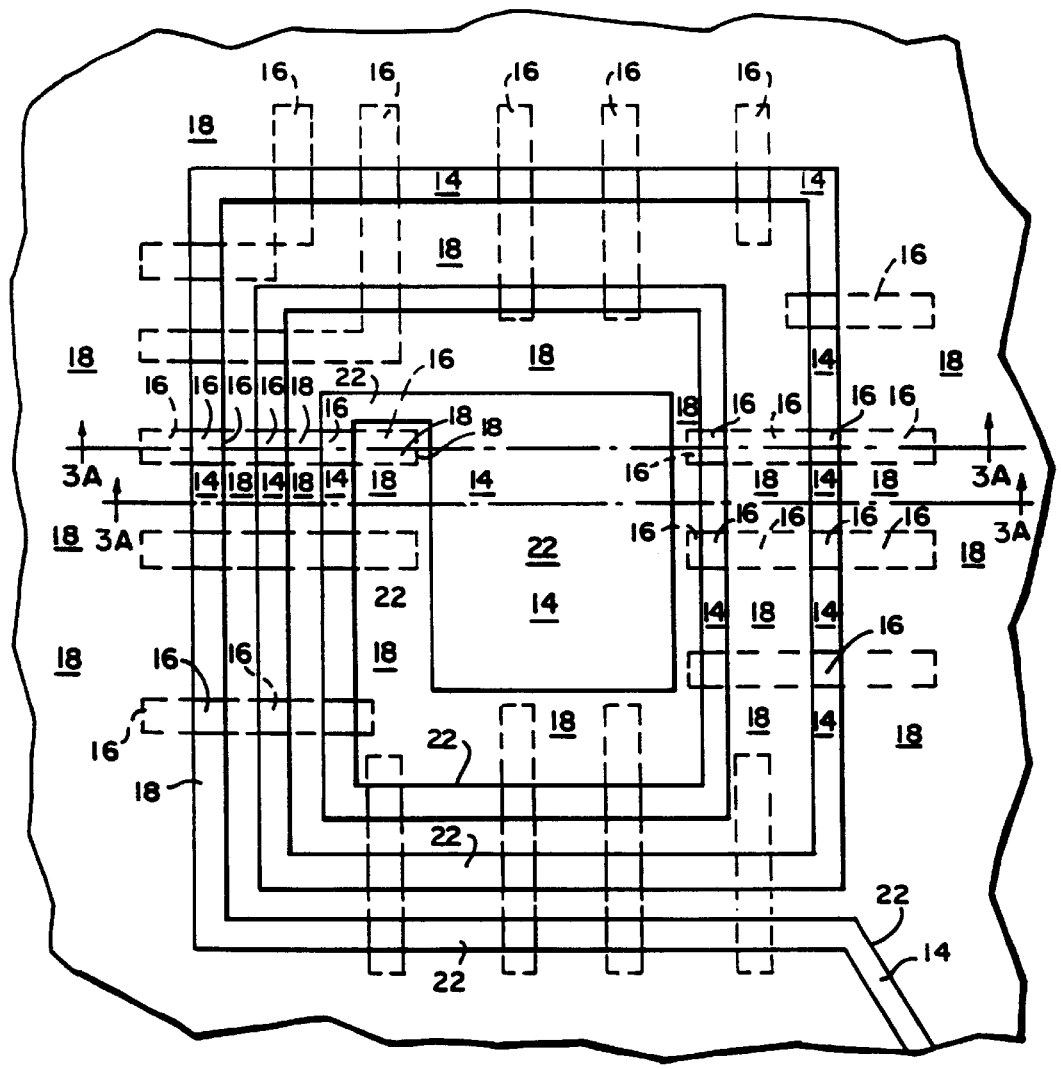
FIG. 3 is a plan view of the substrate having the different photolithograph layer patterned at still another stage in the fabrication of an inductor in accordance with the invention.
Figure 4:
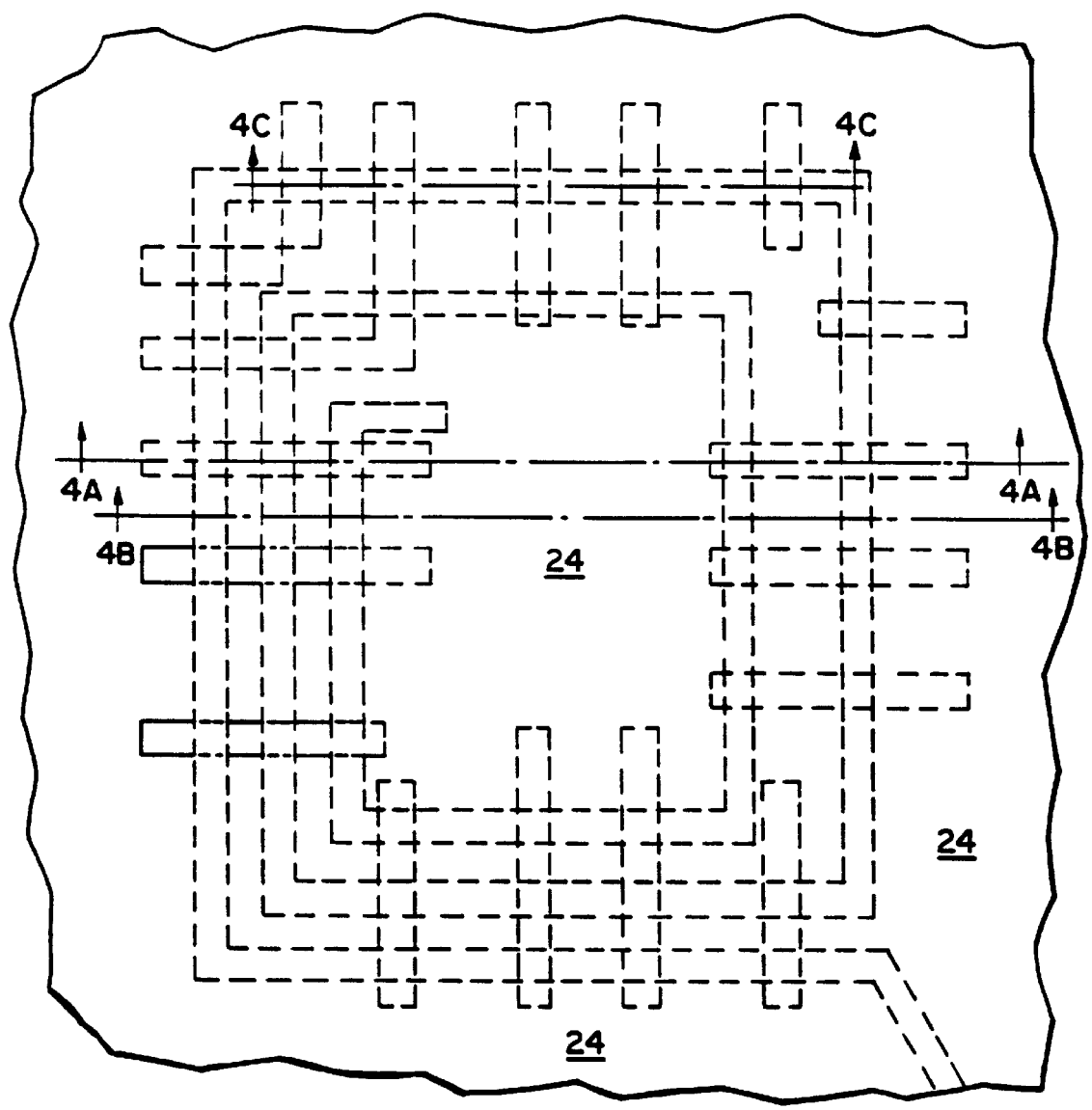
FIG. 4 is a plan view of the substrate having a metalization layer disposed over the patterned different photolithograph layer at yet another stage in the fabrication of an inductor in accordance with the invention.
Figure 4C:
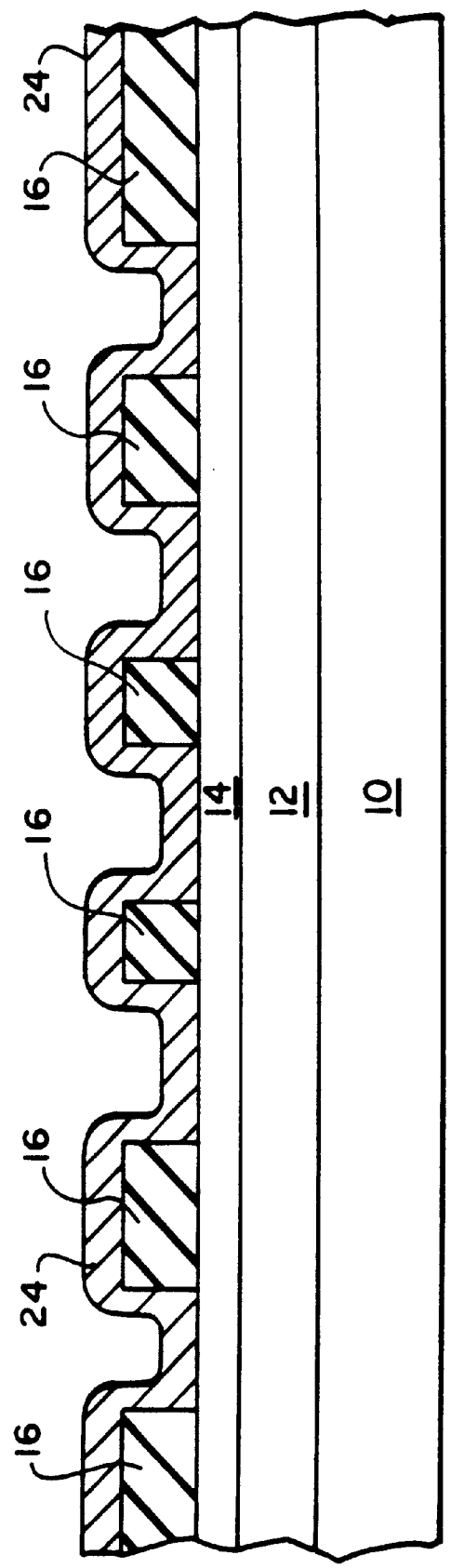
Figure 5:
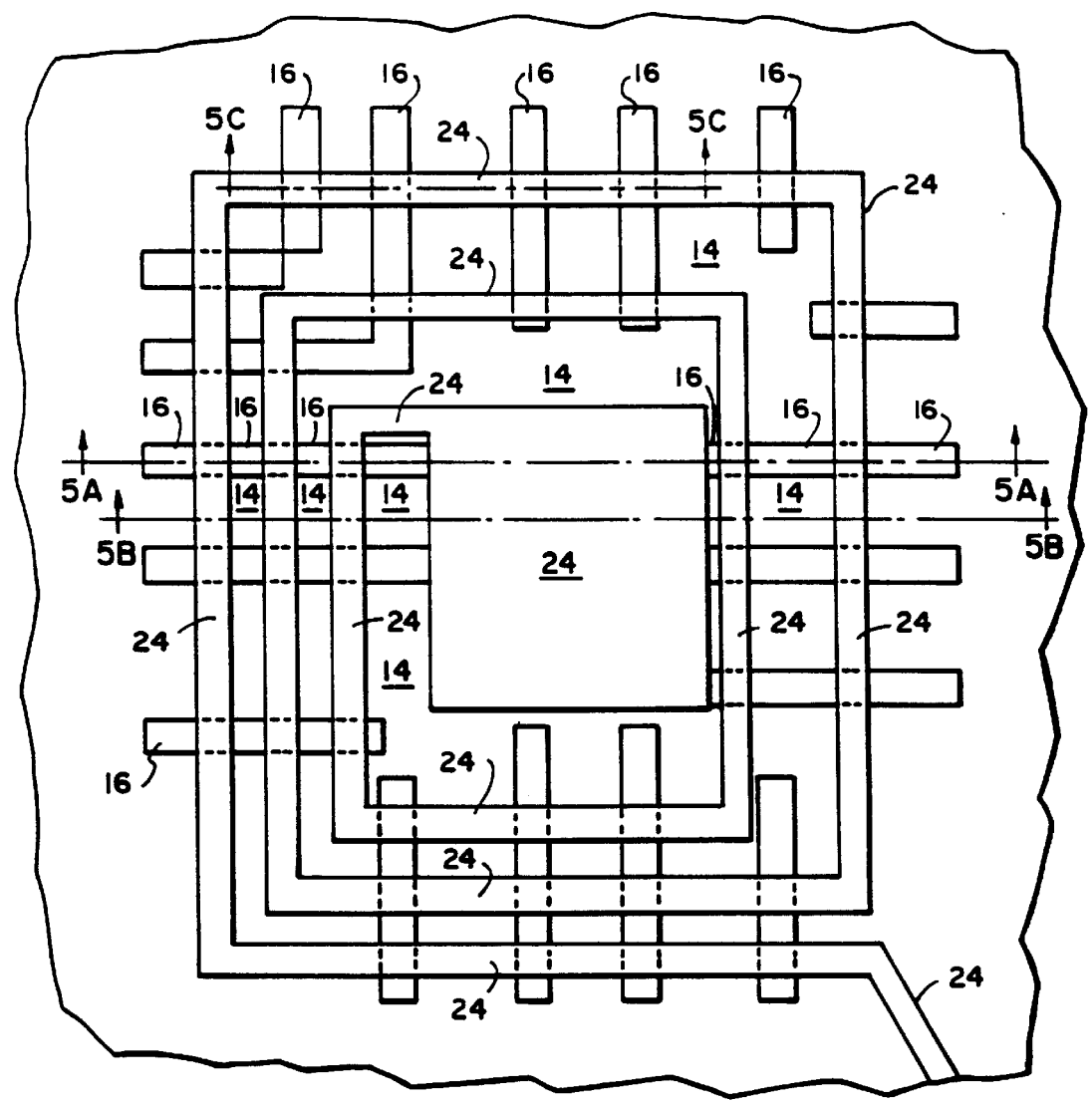
FIG. 5 is a plan view of the substrate having a patterned metalization layer at another stage in the fabrication of an inductor in accordance with the invention.
Figure 5C:
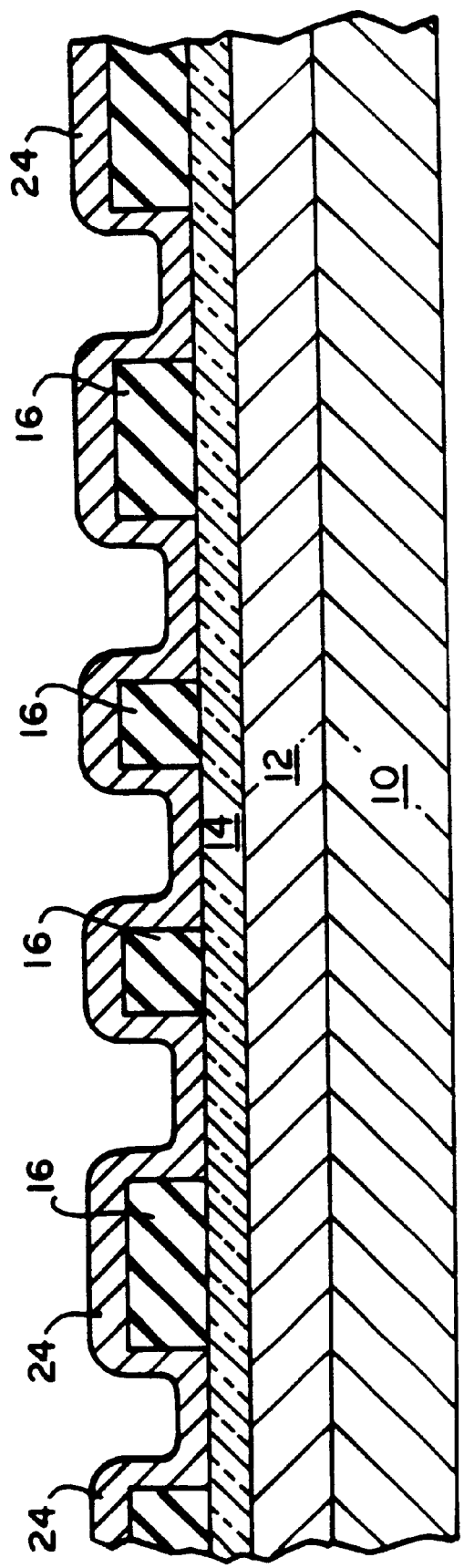
Figure 5D:
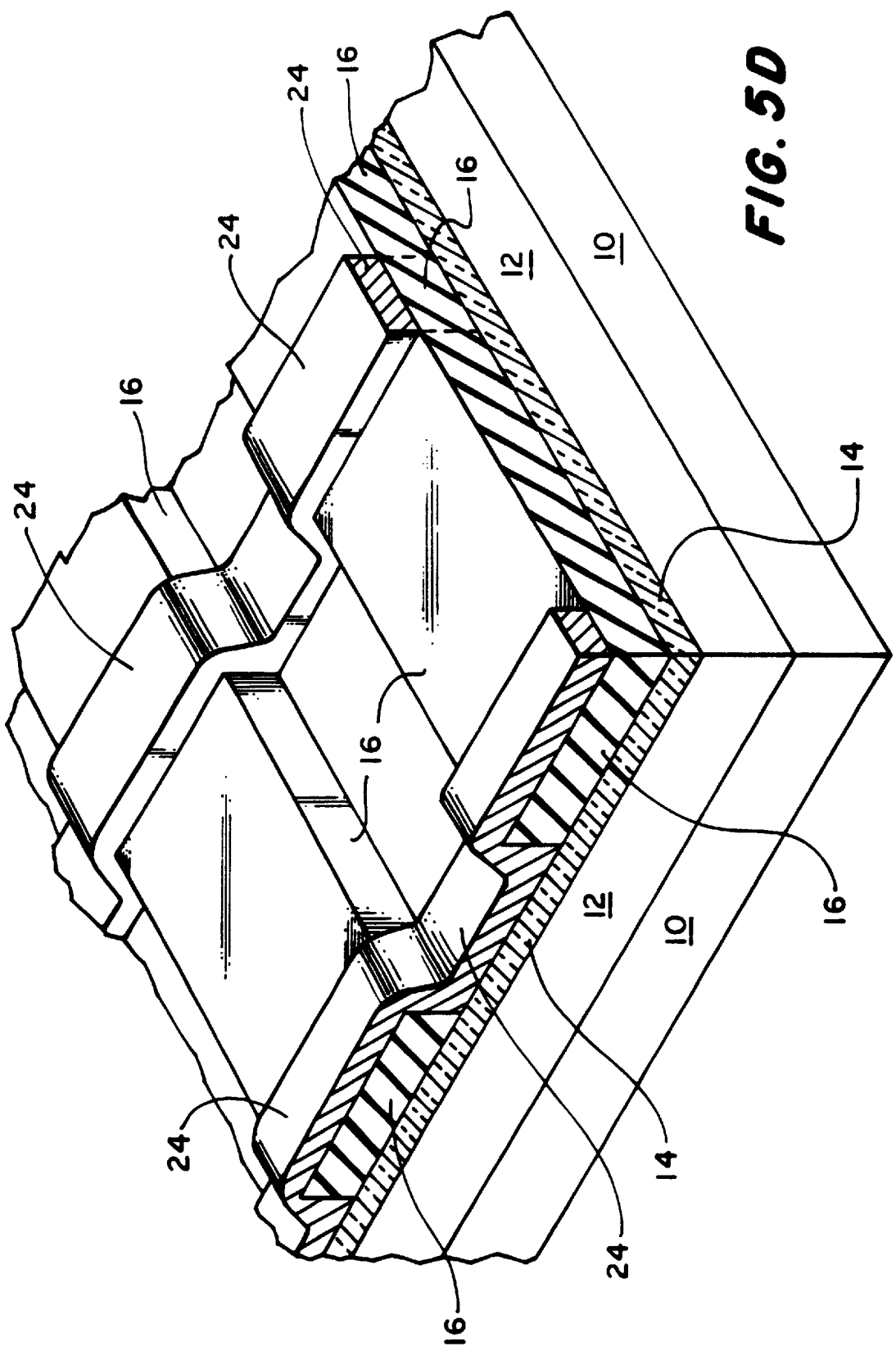
FIG. 5D is a perspective partially broken away sketch of a portion of the structure of FIG. 5, such portion being enclosed by a circle labelled 5D—5D in FIG. 5.
Figure 6:
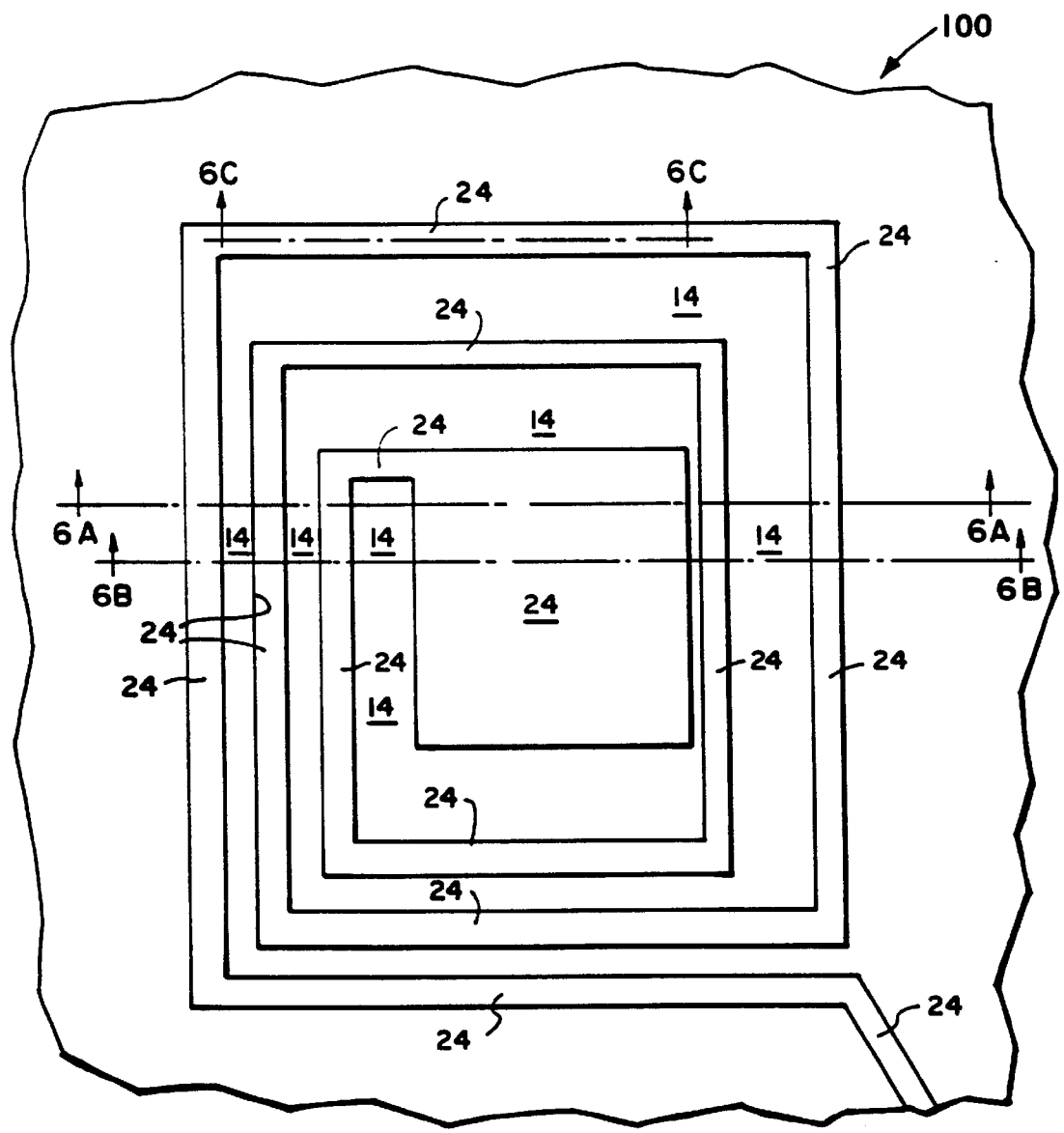
FIG. 6 is a plan view of the inductor in the invention.
Figure 6C:
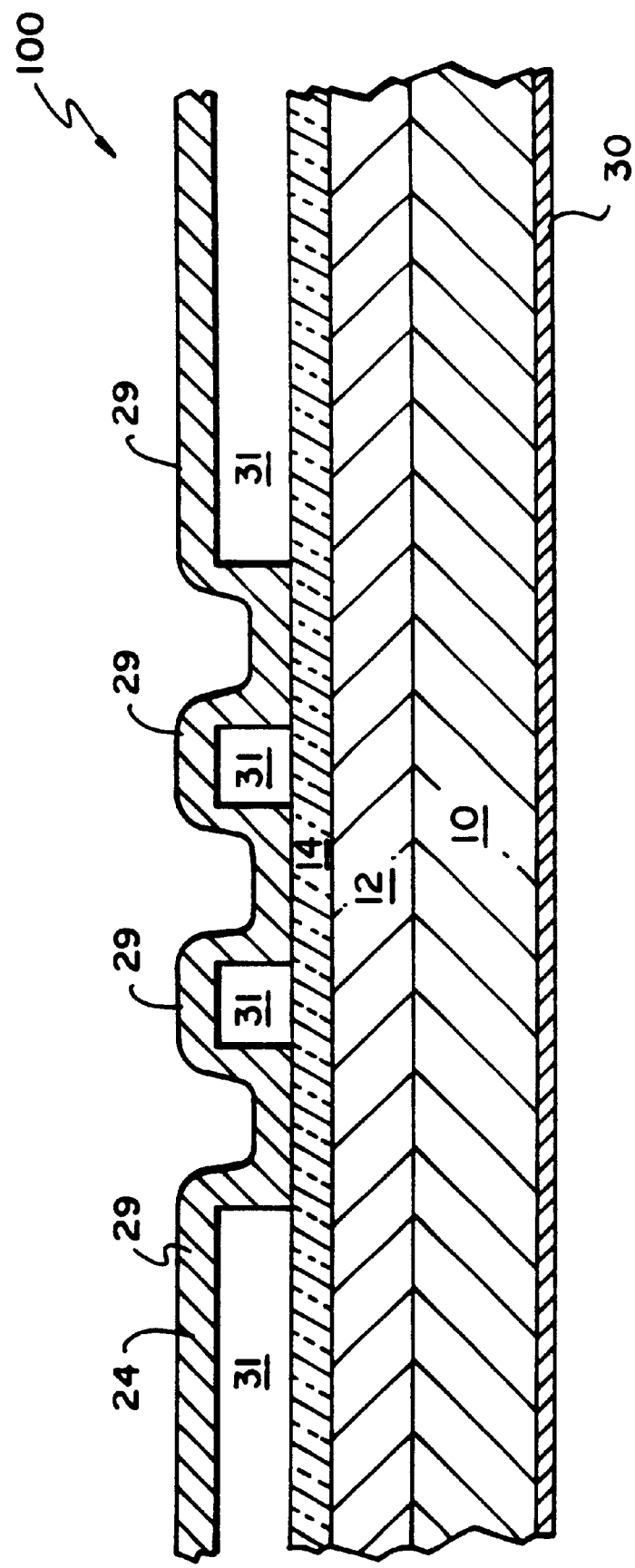
Figure 6D:
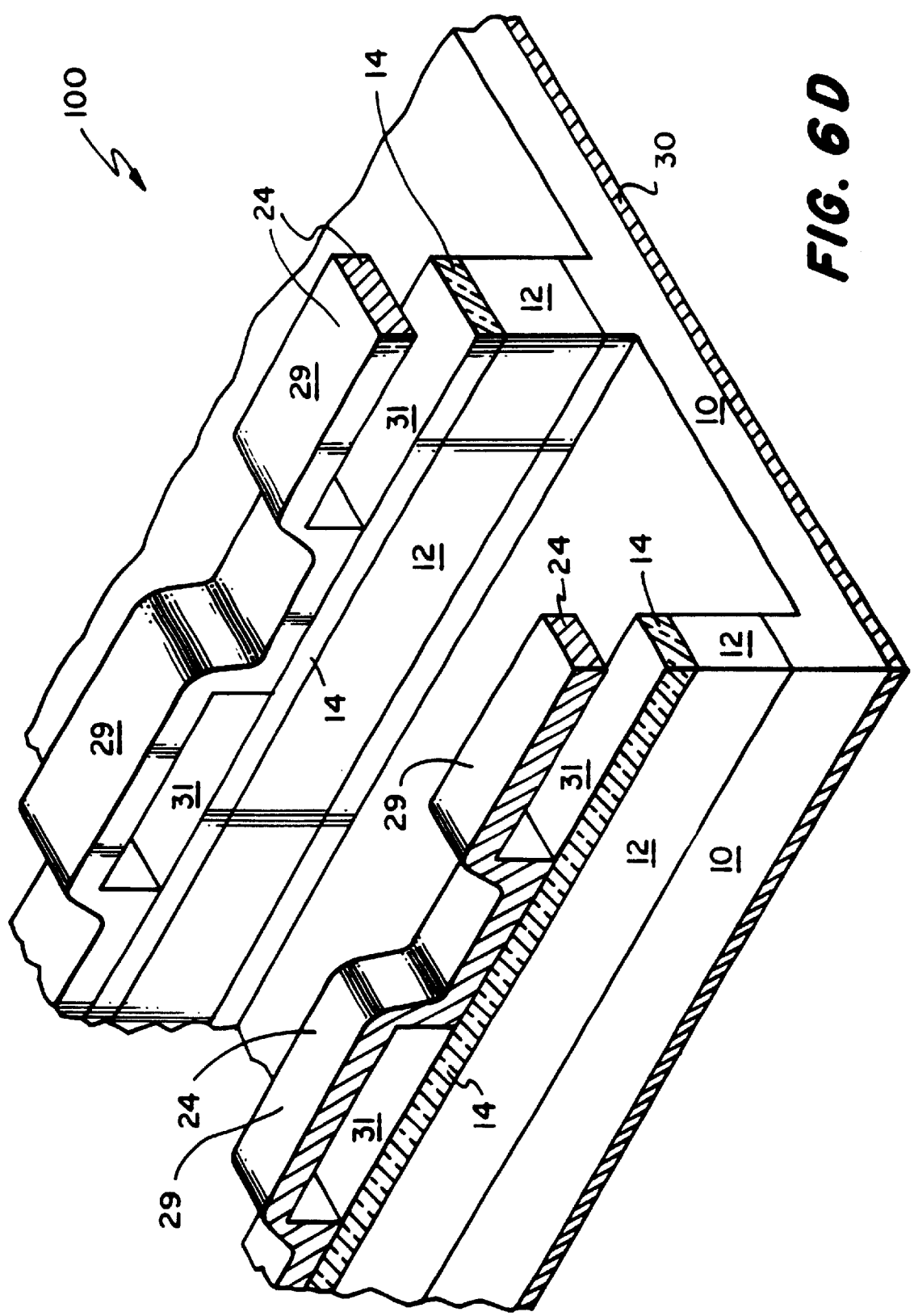
FIG. 6D is a perspective partially broken away sketch of the inductor in accordance with the invention, such portion being enclosed by a circle labelled 6D—6D in FIG. 6.

Next, and referring to FIGS. 2, 2A, and 2B, a second photoresist layer 18, here Novolac, is deposited over the patterned first photoresist layer 16 and over portions of the passivation layer 16 exposed by the patterned first photoresist layer 16. The second photoresist layer 18 is masked and exposed to a less deep ultra-violet light to pattern it with a spiral shaped window disposed over and in vertical alignment with the segmented first photoresist layer 16, as shown in FIGS. 3, 3A and 3B. As will be shown, the window formed in the second photoresist layer is in the same shape as the spiral shaped inductor being formed. Further, an electrical contact pad will be formed in the central region 22 of the inductor and a window is thus formed in the second photoresist layer 18 in the shape of the contact pad.

Next, a metalization layer 24, here a composite lower layer of titanium followed by a thicker layer of gold, is formed over the second photoresist 18 and through the window formed therein onto the patterned first photoresist layer 16 and onto the exposed portions of the passivation layer 14, as shown in FIGS. 4, 4A, 4B and 4C.

Next, the second photoresist layer 18, together with the portions of the metalization layer 24 disposed thereon are removed (i.e., "lifted-off") with acetone leaving a spiral shaped metalization layer, as shown in FIGS. 5, 5A, 5B, 5C and 5D.

Next, the first photoresist layer 16 is removed here using n-methyl pyrolidinone, as shown in FIGS. 6, 6A, 6B, 6C and 6D to provide air-bridged segments 29 which pass over air 31, as shown.

Next, a third photoresist layer not shown, here Novolac, is spun over the formed surface. Next, a window is formed in the third photoresist layer over the patterned metalization layer 24. Next, the exposed portions of the passivation layer 14 are removed, here using a dry etch, here a plasma etch using nitrogen tri-fluoride. Next, exposed portions of the single crystal body 10 are etched here using a dry, vertically directional etch of tetrachloride or boron tri-chloride, for example, to provide the structure shown in FIGS. 6, 6A, 6B, 6C and 6D.

Next, a ground plane conductor 30 is disposed on the bottom surface of the substrate 10 to provide the inductor structure 100 shown in FIGS. 6, 6A, 6B, 6C and 6D.

Thus, with such method an inductor structure is formed in the single crystal body with a spiral shaped pedestal disposed in the upper surface of the body. The body is a dielectric body having a ground plane conductor disposed over a lower surface and a spiral shaped conductor disposed is disposed over the spiral shaped pedestal. Portions of the conductor are separated from underlying portions of the pedestal by air and laterally adjacent portions of the conductor are separated by air.

Other embodiments are within the spirit and scope of the appended claims. For example, the dielectric may be material other than semiconductor material.

What is claimed is:

1. A method for making an inductor structure, comprising the steps of:
   providing a dielectric body;
   patterning a metalization layer into a spiral shaped electrical conductor;
   etching surface portions of the dielectric body exposed by the patterned metalization layer providing a pedestal structure disposed under the patterned metalization layer.

2. The method recited in claim 1 including the step of forming a ground plane conductor on an opposite surface of the dielectric body.

3. A method for making an inductor structure, comprising the steps of:
   providing a dielectric body;
   forming a first photoresist layer over the body;
   patterning the first photoresist layer into a segmented spiral shape;
   depositing a second photoresist layer over the patterned first photoresist layer and over portions of the body exposed by the patterned first photoresist layer;
   patterning the second photoresist layer with a spiral shaped window disposed over and in vertical alignment with the patterned first photoresist layer;
   deposit a metalization layer over the second photoresist and through the window formed therein onto the patterned first photoresist layer and onto the exposed portions of the passivation layer;
   removing the second photoresist layer and the portions of the metalization layer disposed over such second photoresist layer leaving a spiral shaped metalization layer;
   removing the first photoresist layer;
   spinning a third photoresist layer over the formed surface;
   forming a window in the third photoresist layer over the patterned metalization layer;
   remove the exposed portions of the passivation layer;
   etching exposed portions of the dielectric body using a dry, vertically directional etch.

4. A method for making an inductor structure, comprising the steps of:
   providing a single crystal body;
   forming a passivation layer over the body;
   forming a first photoresist layer over the passivation layer;
   patterning the first photoresist layer into a segmented spiral shape;
   depositing a second photoresist layer over the patterned first photoresist layer and over portions of the passivation layer exposed by the patterned first photoresist layer;
   patterning the second photoresist layer with a spiral shaped window disposed over and in vertical alignment with the segmented first photoresist layer;
   deposit a metalization layer over the second photoresist and through the window formed therein onto the patterned first and onto the exposed portions of the passivation layer;
   removing the second photoresist layer and the portions of the metalization layer disposed over such second photoresist layer leaving a spiral shaped metalization layer;
   removing the first photoresist layer;
   spinning a third photoresist layer over the formed surface;
   forming a window in the third photoresist layer over the patterned metalization layer;
   remove the exposed portions of the passivation layer;
   etching exposed portions of the single crystal body using a dry, vertically directional etch.

5. The method recited in claim 4 wherein the single crystal body includes a semi-insulating substrate having an active layer disposed on a surface of the substrate and wherein the bottom of the pedestal is disposed in the semi-insulating substrate and wherein the active devices are formed in the active layer.

6. A method for making an inductor structure, comprising the steps of:
   providing a single crystal body;
   forming a passivation layer over the body;

forming a first photoresist layer of polymethylglutarimide over the passivation layer;

patterning the first photoresist layer into a segmented spiral shape;

depositing a second photoresist layer over the patterned first photoresist layer and over portions of the passivation layer exposed by the patterned first photoresist layer;

patterning the second photoresist layer with a spiral shaped window disposed over and in vertical alignment with the segmented first photoresist layer;

deposit a metalization layer over the second photoresist and through the window formed therein onto the patterned first and onto the exposed portions of the passivation layer;

removing the second photoresist layer and the portions of the metalization layer disposed over such second photoresist layer leaving a spiral shaped metalization layer;

removing the first photoresist layer;

spinning a third photoresist layer over the formed surface;

forming a window in the third photoresist layer over the patterned metalization layer;

remove the exposed portions of the passivation layer;

etching exposed portions of the single crystal body using a dry, vertically directional etch.

* * * * *